United States Patent [19]
Deri

[11] Patent Number: 5,006,906
[45] Date of Patent: Apr. 9, 1991

[54] INTEGRATED SEMICONDUCTOR WAVEGUIDE/PHOTODETECTOR

[75] Inventor: Robert J. Deri, Atlantic Highlands, N.J.

[73] Assignee: Bell Communications Research, Inc., Livingston, N.J.

[21] Appl. No.: 237,087

[22] Filed: Aug. 29, 1988

[51] Int. Cl.$^5$ .................. H01L 29/161; H01L 29/205; H01L 29/225

[52] U.S. Cl. ......................... 357/16; 357/19; 357/30; 350/96.12; 350/96.15

[58] Field of Search ............... 350/96.12, 96.11, 96.15; 357/16, 19, 30 E, 30 L; 372/45, 50

[56] References Cited

U.S. PATENT DOCUMENTS

| | | | |
|---|---|---|---|
| 4,546,480 | 10/1985 | Burnam et al. | 357/16 X |
| 4,815,090 | 3/1988 | Usami et al. | 357/19 X |
| 4,861,128 | 8/1989 | Ishikawa et al. | 350/96.12 X |

OTHER PUBLICATIONS

Yuan, Y. et al., "Monolithic Integration of Curved Waveguides . . . " J. of Lightwave Tech. Dec. 1983, pp. 630-637.

Forbes, N. et al, "Monolithic Integration of Active and Passive Components . . . " 1st Eur. Conf. on Integrated Optics, Sep. 14-15, 1981, 83-87.

"Waveguide-Integrated PIN Photodiode on InP", Electronics Letters, C. Bornholdt et al, vol. 23, No. 1, Jan. 2, 1987, pp. 2-4.

"Monolithic Integrated InGaAlAs/InP Ridge Waveguide Photodiodes for 1.55 μm Operation Grown by Molecular Beam Epitaxy", Applied Physics Letters, P. Cinguino et al, 50 (21), May 25, 1987, pp. 1515-1517.

"Monolithic Integration of An InP Inverted Rib Waveguide with a GaInAs Photodiode", Proceedings of the 4th European Conference on Integrated Optics, M. Erman et al, 1987, pp. 28-31.

"State-of -the-Art Survey of Multimode Fiber Optic Wavelength Division Multiplexing", SPIE, J. L. Spencer, vol. 403, 1983 pp. 117, 118, 122 & 126.

"Frequency Multiplexing Light Source with Monolithically Integrated Distributed-Feedback Diode Lasers", Applied Physics Letters, K. Aiki, et al, vol 29, 29, No. 8, Oct. 15, 1976, pp. 506-508.

Primary Examiner—Andrew J. James
Assistant Examiner—Sara W. Crane
Attorney, Agent, or Firm—James W. Falk

[57] ABSTRACT

An integrated waveguide/detector optical device is fabricated on a semiconductor substrate whose surface includes a step region. Guiding and absorbing layers are grown on the surface in sequence overlying the step region. This is done in a single epitaxial growth cycle. The absorbing layer is patterned to form a non-planar detector that overlies the guiding layer in the step region. Due to bending of the guiding layer in the step region, a strong coupling exists between the overlying detector and light propagating in the guiding layer. Easily fabricated integrated devices having short-length (high-speed) photodetectors are thereby made feasible.

13 Claims, 4 Drawing Sheets

INTEGRATED SEMICONDUCTOR WAVEGUIDE/PHOTODETECTOR

BACKGROUND OF THE INVENTION

This invention relates to the propagation and detection of optical signals and, more particularly, to an integrated semiconductor device that includes an optical waveguide and a photodetector.

Two basically different types of integrated waveguide/detector optical devices are known. In one type of such device, guiding and absorbing (detecting) layers are sequentially formed on top of each other on the planar surface of a substrate. The planar absorbing layer is then lithographically processed and etched to form a detector overlying a prescribed longitudinal extent of the underlying guiding layer. This type of device is described, for example, in "Waveguide-Integrated PIN Photodiode on InP" by C. Bornholdt et al, *Electronics Letters*, Vol. 23, No. 1, Jan. 2, 1987, pp. 2–4; in "Monolithic Integrated InGaAlAs/InP Ridge Waveguide Photodiodes for 1.55 μm Operation Grown by Molecular Beam Epitaxy" by P. Cinguino et al, Applied Physics Letter 50 (21), May 25, 1987, pp. 1515–1517; and in "Monolithic Integration of An InP Inverted Rib Waveguide with a GaInAs Photodiode" by M. Erman et al, *Proceedings of the 4th European Conference on Integrated Optics*, 1987, pp. 28–31.

In the aforedescribed type of integrated optical device, the coupling between light propagating in the planar guiding layer and the overlying planar detector is relatively weak. Therefore, in order to obtain a high degree of light absorption in the detector, the length of the overlying detector must in practice be made relatively long. Lengths of at least about 300 micrometers (μm) for such detectors are typically required. In turn, the capacitance of such a long detector is relatively high and its maximum speed of operation is consequently relatively low. In addition, high capacitance is detrimental to detector performance because it increases the noise and the minimum detectable optical signal.

In a second known type of integrated waveguide/detector optical device, an absorbing layer is grown on a substrate and then lithographically processed and etched to form a detector. Subsequently, a guiding layer is grown on the substrate in abutting relationship with respect to the detector. As a result, the coupling between the detector and light propagating in the guiding layer is very strong. A high degree of light absorption can therefore be achieved in a relatively short-length detector (for example, only about 5-to-10 μm long). Such a detector exhibits a low-capacitance characteristic and is therefore suitable for use in a variety of high-speed optical signal processing applications.

The detector included in the second-described or faster device is sometimes referred to as being "edge-excited". An example of such an edge-excited detector (but not integrated on a single substrate with an associated input waveguide) is described in "High-Speed Zero-Bias Waveguide Photodetectors" by J. E. Bowers et al. *Electronics Letters*, Vol. 22, No. 17, Aug. 14, 1986, pp. 905–906. An example of an integrated waveguide plus photodetector in the "edge-excited" configuration, showing the need for two separate epitaxial growths, is described in "Integrated Waveguide p-i-n Photodetector by MOVPE Regrowth," by S. Chandrasckhar et. al., IEEE Electron. Dev. Lett. Vol. EDL-8, No. 11, Nov. 1987, pp. 512–514.

Improved performance of integrated optical devices of the two types described above is usually obtained if the aforementioned guiding and absorbing layers are formed by standard epitaxial growth processes. The guiding and absorbing layers of the first-described or slower type of device can both be formed in sequence in a chamber in a single epitaxial growth cycle. This considerably simplifies the fabrication of the device. By contrast, the epitaxial guiding and absorbing layers of the second-described or faster device must be formed in two distinct epitaxial growth cycles separated by lithographic processing and etching of the absorbing layer. This considerably complicates the fabrication of the faster or edge-excited integrated device.

Accordingly, efforts have been directed by workers skilled in the art aimed at trying to devise an integrated waveguide/detector device characterized by both high speed and ease of fabrication. It was recognized that these efforts, if successful, would contribute significantly to the realization of high-performance low-cost optical signal processing systems.

SUMMARY OF THE INVENTION

In accordance with the principles of the present invention, a step is formed on the surface of a semiconductor substrate. Guiding and absorbing layers are then grown in sequence on the substrate surface overlying the step in a single epitaxial growth cycle. The absorbing layer is then lithographically processed and etched to form a non-planar detector that overlies the guiding layer in the region of the step. Due to bending of the guiding layer in the step region, a strong coupling exists between the overlying detector and light propagating in the guiding layer. Consequently, the detector may be relatively short in length and yet exhibit a high light-absorption property. Such a device is easy to fabricate and possesses advantageous low-capacitance and high-speed characteristics.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
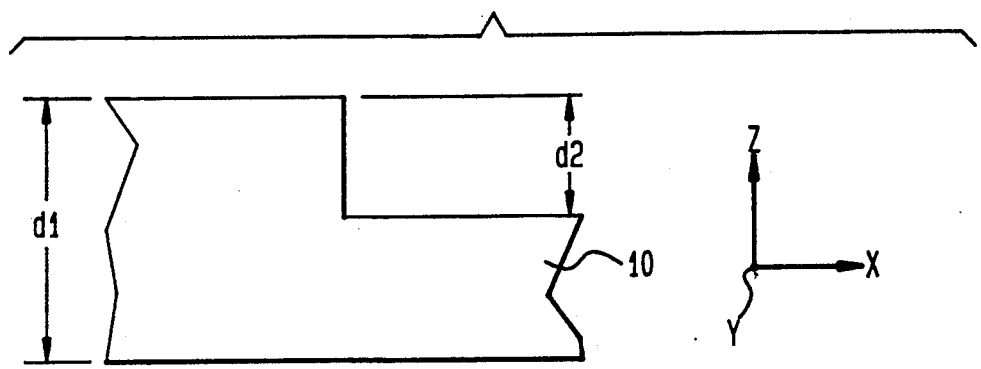
FIG. 1 is an idealized cross-sectional view of a substrate having a step therein.

FIG. 1 shows a portion of a semiconductor substrate 10 on which an integrated optical waveguide/photodetector device is to made. Illustratively, the substrate will be assumed herein to be made of InP. But, for example, the substrate may also be made of other III-V semiconductors such as GaAs or of other semiconductors such as silicon or even of other materials such as glass or lithium niobate.

The thickness of the substrate 10 of FIG. 1 is not critical. By way of example, the thickness d1 of the substrate is about 375 $\mu$m. In accordance with the principles of the present invention, a step is formed in the substrate 10. This is done in standard ways known in the art. For InP, such a step may be formed, for example, in a conventional wet chemical etching step utilizing HCl. Illustratively, the height d2 of the depicted step is approximately 2-to-20 $\mu$m.

Figure 2:
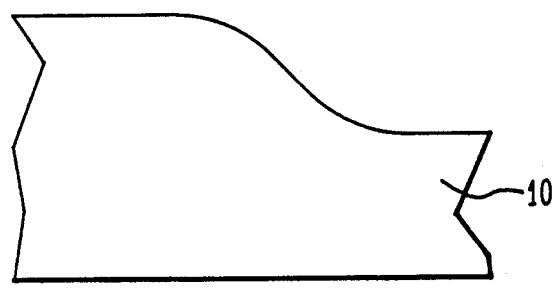
FIG. 2 shows the contour of the FIG. 1 step as it is realized in practice in some illustrative embodiments of the present invention.

In practice, the step formed in the substrate 10 may have a more rounded contour than is represented in the idealized view of FIG. 1. Such a rounded step is depicted in FIG. 2 and will be shown in all subsequent figures.

In any case, the exact nature of the step is not critical, although particular illustrative dimensions are specified herein. In general, the step simply must be deep enough to cause appreciable curvature of the layers grown thereover.

Figure 3:
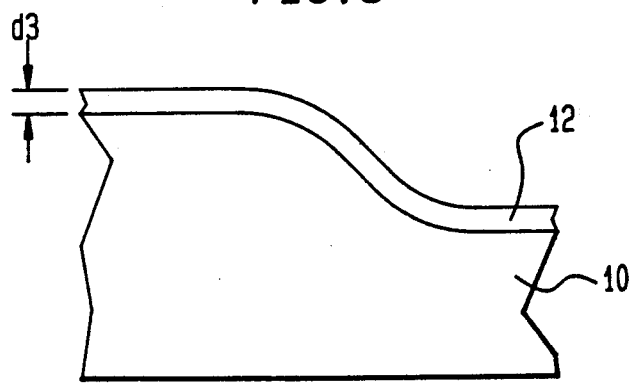
FIG. 3 depicts a guiding layer formed on the stepped substrate of FIG. 2.

The step-induced bending of the layers causes a more rapid transfer of light from the waveguiding layer to the absorbing layer than would be the case if the layers were grown on a planar substrate. As indicated in FIG. 3, a conventional guiding layer 12 for optical signals is formed on the top non-planar surface of the substrate 10. Although the layer 12 can be formed in various ways, it is generally advantageous from a device performance standpoint to form it (and the subsequently described layers) by epitaxial growth techniques. By way of example, the layer 12 is formed by metal-organic chemical-vapor-deposition (MOCVD) or liquid-phase-epitaxy (LPE) or molecular-beam-epitaxy (MBE) techniques, all of which are known in the art.

Illustratively, the epitaxial guiding layer 12 (FIG. 3) formed on the InP substrate 10 is made of a quaternary material selected from the class of materials generally designated InGaAsP or from the class of materials generally designated InGaAlAs. Alternatively, the layer 12 may comprise a superlattice (multiple interleaved layers) of, for example, InP and InGaAs.

By way of example, the thickness d3 of the guiding layer 12 shown in FIG. 3 is approximately 0.4-to-2 $\mu$m. For single-mode operation, the thickness of the layer 12 tends to fall toward the lower end of the indicated range. Also, a thinner layer 12 causes improved coupling of light to an overlying detector. On the other hand, when the device described herein is utilized in conjunction with associated single-mode optical fibers whose core diameter is typically about 8 $\mu$m, the thickness of the layer 12 should advantageously be increased to at least 2 82 m. Otherwise, much of the light carried by the fibers will not be transferred to the layer 12.

Various ways are known in the art for confining light launched into the layer 12 to propagate in a narrow longitudinal region of the layer. Two such standard ways are depicted in FIGS. 4 and 5, respectively.

Figure 4:
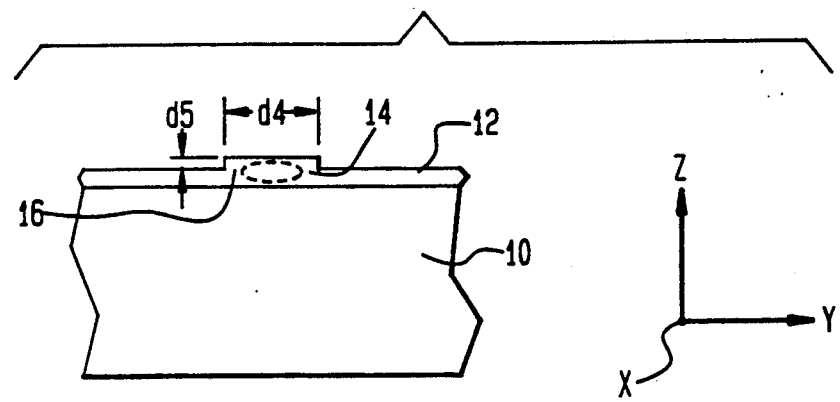
FIGS. 4 and 5 are each end views of FIG. 3 showing two different ways in which to define a narrow waveguide in the guiding layer.

In FIG. 4, the layer 12 is shown as including a longitudinally extending x-direction rib portion 14. In device embodiments of the present invention, the width d4 of the rib portion 14 is, for example, about 2-to-10 $\mu$m. Illustratively, the height d5 of the portion 14 is approximately 0.2-to-2 $\mu$m. A cross-sectional representation of the light propagated by the rib portion 14 is approximated in FIG. 4 by dash line 16.

Figure 5:
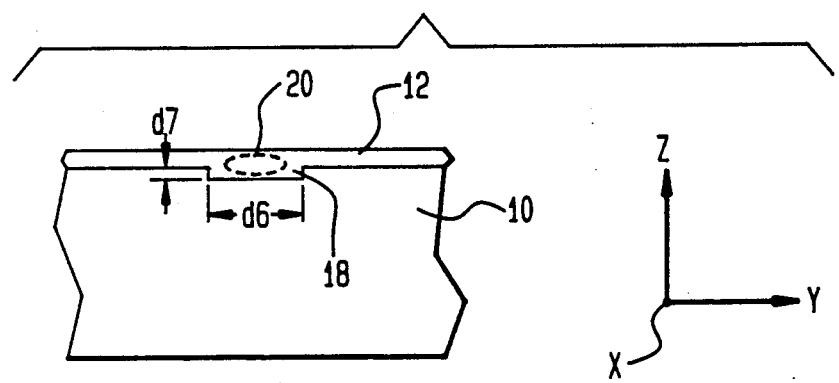

In the FIG. 5 depiction, a longitudinally extending x-direction trench 18 is shown formed in the substrate 10. When the layer 12 is grown, the trench 18 is filled in with guiding material. In one specific illustrative embodiment of this invention, the width d6 of the trench 18 is about 4-to-12 $\mu$m and and depth d7 is about 0.3-to-2 $\mu$m. Dash line 20 indicates in cross-section the light that is propagated in the FIG. 5 arrangement. Hereinafter, for purposes of a specific illustrative example only, the guiding layer 12 will in subsequent figures be assumed to have the configuration represented in FIG. 5.

After depositing the epitaxial guiding layer 12 on the substrate 10, three additional epitaxial layers are grown in sequence on the particular illustrative FIG. 3 structure. Advantageously, this is done without breaking vacuum while the structure remains in the epitaxial chamber. After these additional growths, the structure appears as represented in FIG. 6.

Layer 22 (FIG. 6) that directly overlies the guiding layer 12 will be patterned later to form a bottom contact for the detector that is being fabricated. Layer 24, which is made, for example, of weakly doped InGaAs, constitutes the absorbing layer from which the detector will be made. Top-most layer 26 will be patterned later to form an upper contact for the detector. Advantageously, the layer 22 comprises n$^+$-type InGaAs or InP and the layer 26 comprises p$^+$-type InGaAs. Each of the layers 22 and 26 is, for example, about 0.1 $\mu$m thick.

The material of the absorbing layer 24 is selected to have a relatively narrow band-gap. In particular, the band-gap is chosen to be sufficiently narrow that all the light entering the layer 24 from the guiding layer 12 will be absorbed.

Figure 6:
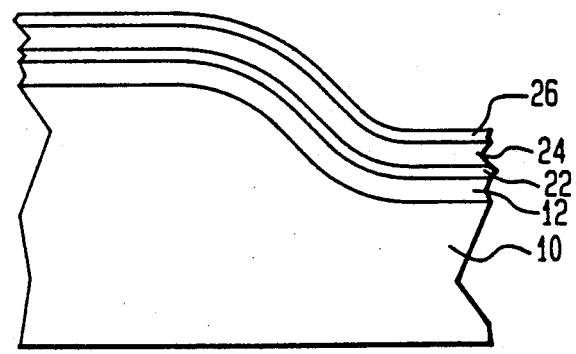
FIG. 6 represents the FIG. 3 structure after additional layers are sequentially grown thereon.

Next, the top three layers 22, 24 and 26 of FIG. 6 are patterned. This is done by conventional lithographic and etching techniques. For etching InGaAs, a wet chemical etchant such as a standard mixture of $H_2SO_4$, $H_2O_2$ and $H_2O$ is satisfactory. The resulting detector formed from these layers is shown in FIG. 7.

Figure 7:
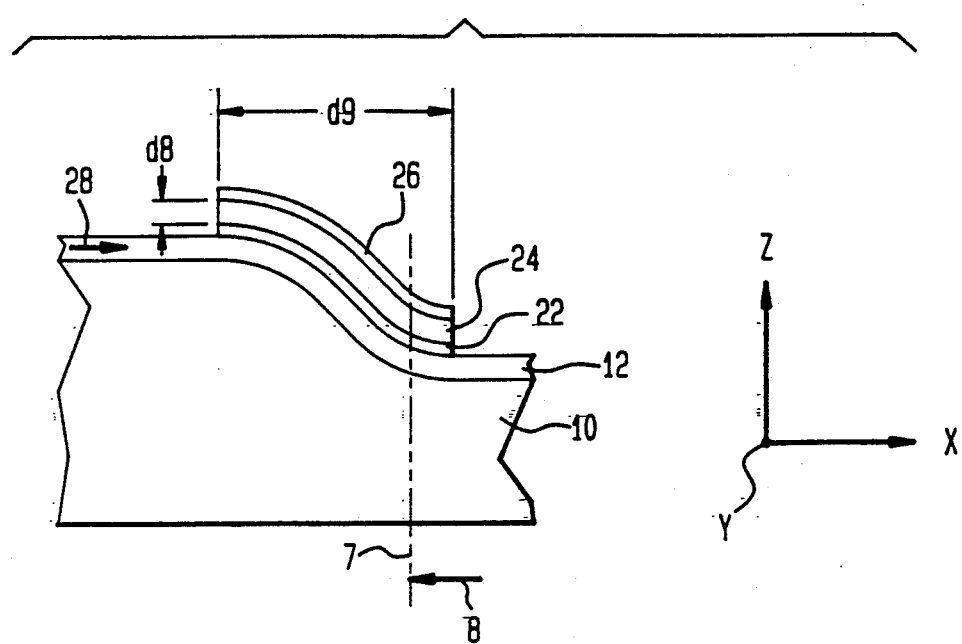
FIG. 7 shows a detector formed from the additional layers represented in FIG. 6.

By way of example, the thickness d8 of the absorbing layer 24 shown in FIG. 7 is selected to be about 0.2-to-2 $\mu$m. By varying this thickness and the height of the step in the substrate 10, the layer 24 can be made to behave more like either an edge-excited photodetector or a top-layer photodetector.

In FIG. 7, light propagating from left to right in the guiding layer 12 is represented by arrow 28. As is well known, the indices of refraction of the layer 12 and the substrate 10 are chosen relative to that of the air overlying the left-hand portion of layer 12 such that the light is highly confined to the layer 12 in that portion. As soon as the light reaches the portion of the layer 12 over which the layer 24 lies, some of the light is weakly coupled to the overlying layer 24. And, as the layer 12 bends over the depicted step, the light therein tends to follow a straight-line path in the indicated x direction. As a result, the propagating light is strongly coupled directly into the absorbing layer 24 in much the same way as occurs in an edge-excited photodetector. In one illustrative device, by making the length d9 of the layer 24 only appropriately 20-to-30 $\mu$m long, all or substantially all of the light in the layer 12 is transferred into the layer 24. In that case, the guiding layer 12 may end in line with or shortly beyond the right-hand edge of the depicted detector.

If desired, less than all of the light in the guiding layer 12 of FIG. 7 can be coupled into the absorbing layer 24. This is easily done by appropriately selecting the length and thickness of the layer 24 and/or the height of the step in the substrate. In that case, some predetermined amount of the light propagating in the layer 12 is purposely allowed to continue on beyond the depicted detector to other portions (not shown) of the indicated integrated device.

Figure 8:
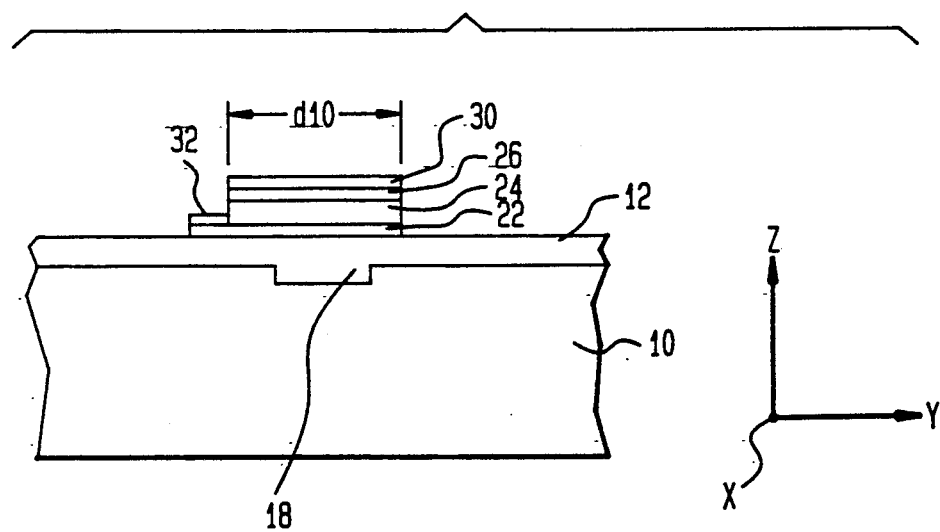
FIG. 8 is an end view of the FIG. 7 device.

FIG. 8 is a cross-sectional side depiction along line 7 of FIG. 7 as viewed in the direction of arrow 8 of FIG. 7. As illustratively represented in FIG. 8, the width d10 of the absorbing layer 24 is greater than the width of the underlying filled trench 18. This is so because some of the optical field associated with the propagating light typically extends beyond the width of the trench.

Illustratively, the $p^+$-type layer 26 (FIG. 8) covers the entire top surface of the layer 24. In turn, a standard metallic layer 30 made, for example, of Ti/Au overlies the layer 26. This constitutes the top electrical contact of the indicated detector.

As shown in FIG. 8, the previously mentioned $n^+$-type layer 22 is patterned to include a side portion over which the detecting layer 24 does not lie. In turn, a standard metallic layer 32 made, for example, of alloyed Au:Ge/Au overlies the indicated side portion of the layer 22. This constitutes the bottom electrical contact of the detector.

Figure 9:
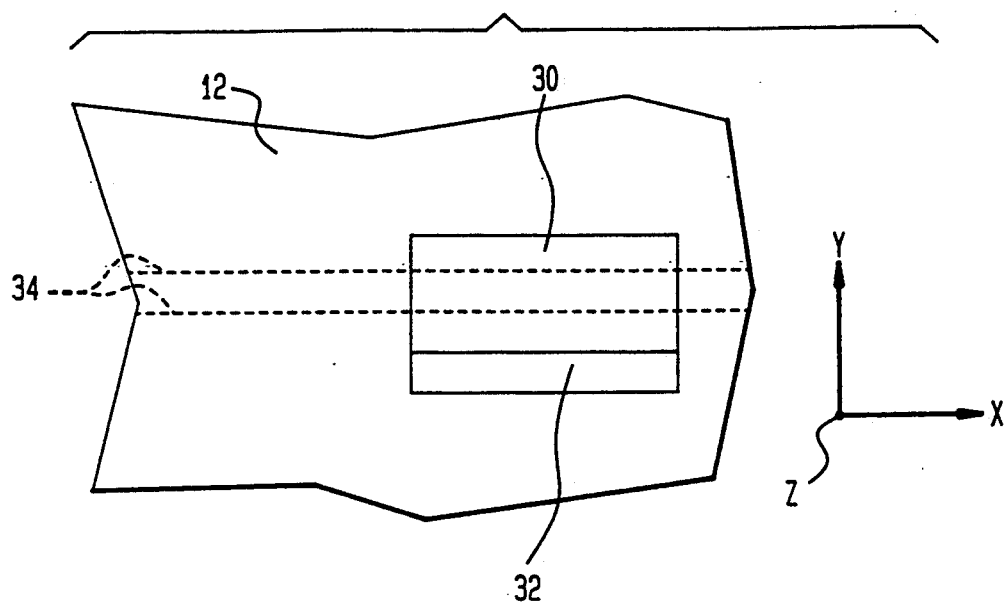
FIG. 9 is a top view of the FIG. 7 device.

FIG. 9, which is a top view of FIG. 7, includes dash lines 34 that indicate the outline of the underlying longitudinally extending x-direction waveguide included in the herein-described device. Also, shown in FIG. 9 are the layers 30 and 32 which, as specified above, comprise the top and bottom contacts respectively, of the detector.

The particular contact arrangement shown in FIGS. 7 through 9 and described above is illustrative only. Various other ways of making electrical contact to the detector specified herein are feasible and may be advantageous in certain cases (for example if the layer 24 is relatively thick) to enhance the speed of operation of the device. By way of example, FIGS. 10 and 11 each schematically depict a particular alternative way to establish contact to the detector. Additional features, such as insulating layers and large metallic bond pads, may also be added to the device to improve contact fabrication reliability and bonding to external connectors, as is well known in the art.

Figure 10:
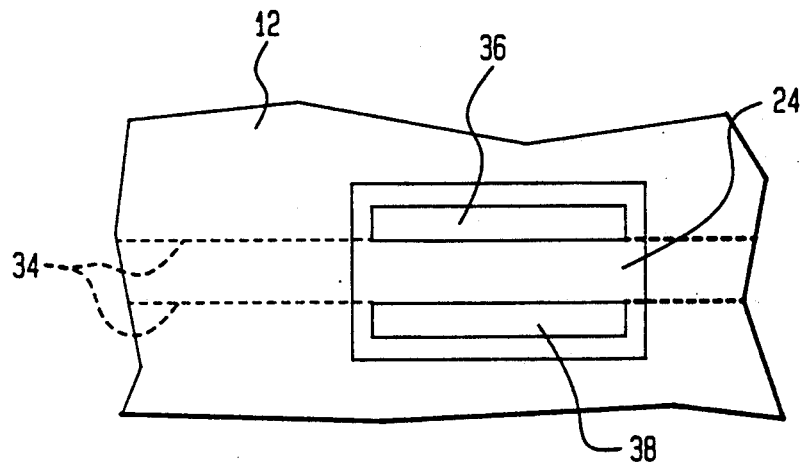
FIGS. 10 and 11 each show specific illustrative alternative ways in which electrical contacts may be made to a detector fabricated in accordance with the principles of the present invention.
Figure 11:
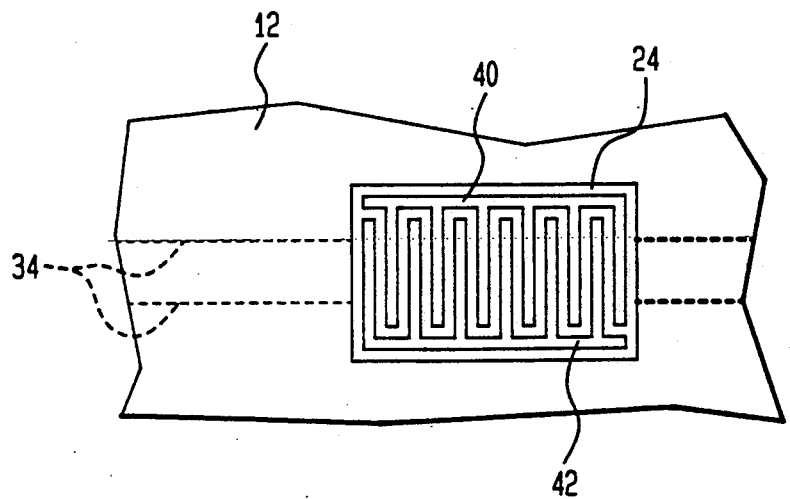

In FIG. 10, which is a top view oriented similarly to FIG. 9, standard spaced-apart contacts 36 and 38 are shown made directly to opposite side of the top surface of the absorbing layer 24. These contacts comprise, for example, conventional metallized $n^+$-type and $p^+$-type regions. (In this case, the previously described layers 22, 26, 30 and 32 are not needed.) In FIG. 11, the spaced-apart contacts made on the top surface of the layer 24 comprise two interdigitated contacts 40 and 42. This is a particularly advantageous contact arrangement in that carriers generated in the layer 24 need travel only a relatively short distance before being collected by adjacent oppositely poled fingers of the contacts 40 and 42.

Finally, it is to be understood that the above-described arrangements and techniques are only illustrative of the principles of the present invention. In accordance with these principles, numerous modifications and alternatives may be devised by those skilled in the art without departing from the spirit and scope of the invention.

What is claimed is:

1. An integrated optical device comprising:
   a substrate having a step region in one main planar surface thereof,
   means including an optical signal waveguiding layer having a straight portion on said main planar surface and a curved nonplanar portion overlying said step region for propagating an optical signal along said planar surface toward and over said step region,
   and means including a curved nonplanar photodetecting layer overlying substantially the entire curved nonplanar portion of said waveguiding layer in said step region for detecting in said step region the optical signal propagated along said planar surface toward and over said step region.

2. A device as in claim 1 wherein said substrate comprises a semiconductor.

3. A device as in claim 2 wherein said semiconductor substrate comprises InP.

4. A device as in claim 3 wherein said waveguiding layer includes In, Ga and As.

5. A device as in claim 4 wherein said waveguiding layer comprises a quaternary semiconductor material.

6. A device as in claim 5 wherein said quaternary material comprises a material selected from the class designated InGaAsP.

7. A device as in claim 5 wherein said quaternary material comprises a material selected from the class designated InGaAlAs.

8. A device as in claim 4 wherein said waveguiding layer comprises a superlattice.

9. A device as in claim 8 wherein said superlattice comprises interleaved layers of InP and InGaAs.

10. A device as in claim 4 wherein said photodetecting layer comprises InGaAs.

11. A device as in claim 1 further including electrical contacts on the respective top and bottom surfaces of said photodetecting layer.

12. A device as in claim 1 further including spaced-apart contacts on the top surface of said photodetecting layer.

13. A device as in claim 12 wherein said contacts comprise interdigitated fingers.

* * * * *